United States Patent
Yonehara et al.

(10) Patent No.: US 12,218,654 B2
(45) Date of Patent: Feb. 4, 2025

(54) SWITCHING DEVICE

(71) Applicants: Kabushiki Kaisha Toshiba, Tokyo (JP); Toshiba Electronic Devices & Storage Corporation, Tokyo (JP)

(72) Inventors: Naoya Yonehara, Kawasaki Kanagawa (JP); Shuji Toda, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 18/111,492

(22) Filed: Feb. 17, 2023

(65) Prior Publication Data
US 2024/0106426 A1    Mar. 28, 2024

(30) Foreign Application Priority Data
Sep. 26, 2022  (JP) .................................. 2022-152166

(51) Int. Cl.
*H03K 17/0812*  (2006.01)
*H03K 17/16*  (2006.01)

(52) U.S. Cl.
CPC ..... *H03K 17/08122* (2013.01); *H03K 17/162* (2013.01)

(58) Field of Classification Search
CPC ........... H03K 17/08122; H03K 17/162; H03K 19/01714; H03K 19/01735; H03K 5/12; H03K 17/04; H03K 17/041; H03K 17/04106; H03K 19/01; H03K 19/017; H03K 19/01707
See application file for complete search history.

(56) References Cited

U.S. PATENT DOCUMENTS

| | | | |
|---|---|---|---|
| 6,072,354 A | 6/2000 | Tachibana et al. | |
| 10,855,271 B2 | 12/2020 | Imasato et al. | |
| 2004/0145407 A1* | 7/2004 | Shirasawa ............ | H03K 17/162 327/434 |
| 2021/0184667 A1 | 6/2021 | Hayashi et al. | |
| 2021/0351177 A1 | 11/2021 | Saito | |

FOREIGN PATENT DOCUMENTS

| | | |
|---|---|---|
| JP | H10-154391 A | 6/1998 |
| JP | 2021-048020 A | 3/2021 |
| JP | 2021-097324 A | 6/2021 |
| JP | 2012-253897 A | 12/2021 |
| WO | 2018110230 A1 | 6/2018 |
| WO | 2021024643 A1 | 2/2021 |

* cited by examiner

*Primary Examiner* — Jung Kim
(74) *Attorney, Agent, or Firm* — Kim & Stewart LLP (57) ABSTRACT

Switching device includes a first terminal, a second terminal, a first transistor, a second transistor, a third transistor, a fourth transistor, and a control circuit. The control circuit is configured to control the first transistor, the second transistor, the third transistor, and the fourth transistor. The control circuit is configured to, when supply of the first voltage to the third node is stopped, turn the second transistor from an off state to an on state, turn the third transistor and the fourth transistor from an on state to an off state, and after a first period passes, turn the first transistor from an off state to an on state.

5 Claims, 8 Drawing Sheets

SWITCHING DEVICE

CROSS-REFERENCE TO RELATED APPLICATIONS

This application is based upon and claims the benefit of priority from Japanese Patent Application No. 2022-152166, filed Sep. 26, 2022, the entire contents of which are incorporated herein by reference.

FIELD

Embodiments described herein relate generally to a semiconductor device.

BACKGROUND

A semiconductor device for supplying power to loads is known.

DETAILED DESCRIPTION

In general, according to one embodiment, semiconductor device includes a first terminal, a second terminal, a first transistor, a second transistor, a third transistor, a fourth transistor, and a control circuit. The first transistor includes a first end and a second end. The first end of the first transistor is coupled to a first node. The second end of the first transistor is coupled to the first terminal. The second transistor includes a first end and a second end. The first end of the second transistor is coupled to a second node. The second end of the second transistor is coupled to the second terminal. The third transistor includes a first end and a second end. The first end of the third transistor is coupled to a third node to which a first voltage is supplied. The second end of the third transistor is coupled to the first node. The fourth transistor includes a first end and a second end. The first end of the fourth transistor is coupled to the third node. The second end of the fourth transistor is coupled to the second node. The control circuit is configured to control the first transistor, the second transistor, the third transistor, and the fourth transistor. The control circuit is configured to, when supply of the first voltage to the third node is stopped, turn the second transistor from an off state to an on state, turn the third transistor and the fourth transistor from an on state to an off state, and after a first period passes, turn the first transistor from an off state to an on state.

Embodiments will be described below with reference to the drawings. In the descriptions below, structural elements having approximately the same function and configuration will be denoted by the same reference symbol. The embodiments described below are intended to exemplify the technical ideas. The embodiments are not intended to limit the materials, shapes, structures, arrangements, etc. of the components. The embodiments can be modified in various ways.

(1) First Embodiment

A semiconductor device according to a first embodiment will be described.

(1-1) Configuration (1-1-1) Overall Configuration of Semiconductor Device

Figure 1:
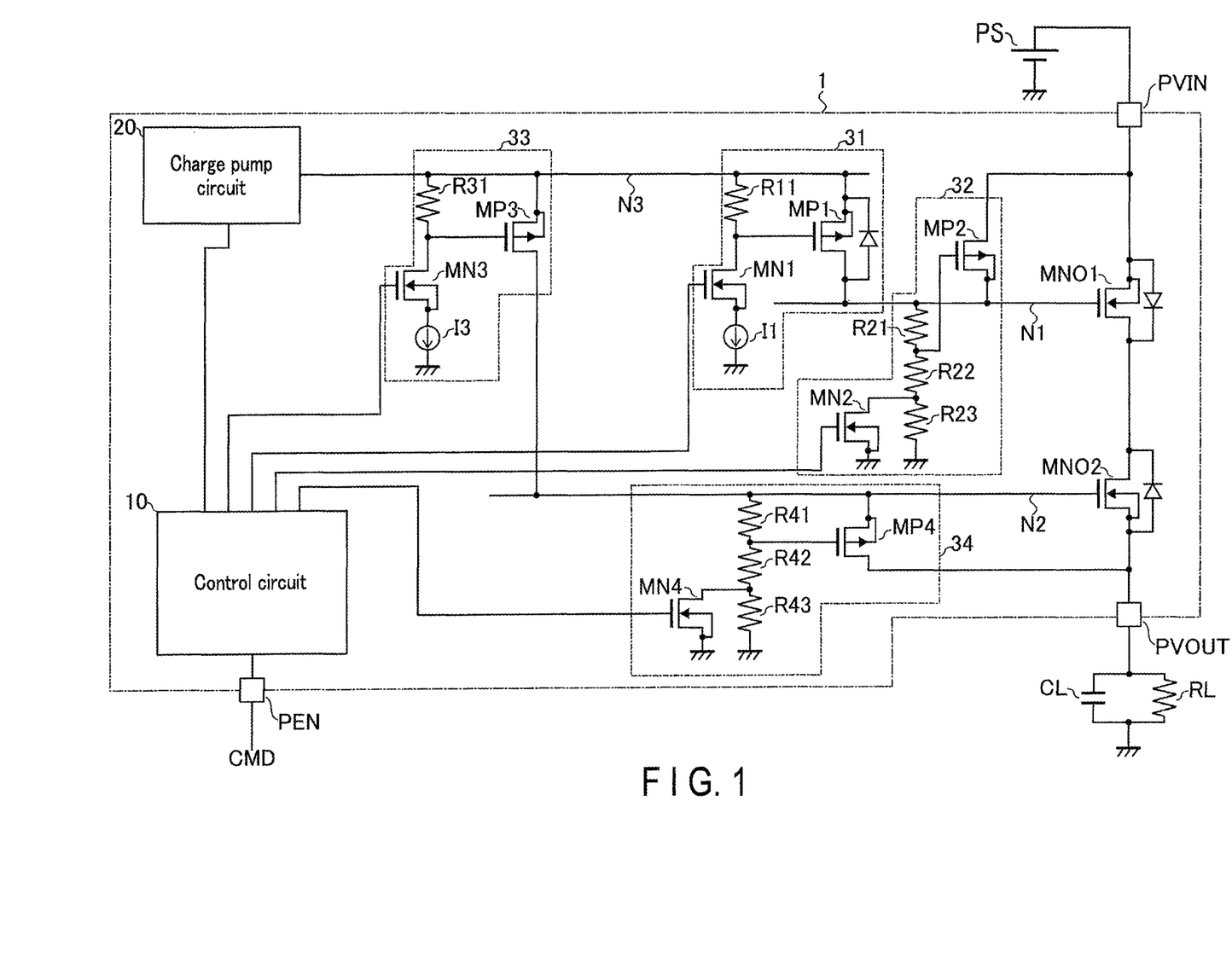
FIG. 1 is a circuit diagram for explaining an example of a configuration of a semiconductor device according to a first embodiment.

FIG. 1 is a circuit diagram for explaining an example of a configuration of the semiconductor device according to the first embodiment. The semiconductor device 1 is a load switch that supplies power to loads. The semiconductor device 1 is, for example, an integrated circuit (IC) chip.

The semiconductor device 1 includes terminals PVIN, PVOUT, and PEN, transistors MNO1 and MNO2, a control circuit 10, a charge pump circuit 20, and switching circuits 31, 32, 33, and 34.

The terminal PVIN is an input terminal of the semiconductor device 1. A power supply PS provided outside the semiconductor device 1 is coupled to the terminal PVIN. The power supply PS outputs a voltage VPS. That is, the voltage VPS is applied to the terminal PVIN.

The terminal PVOUT is an output terminal of the semiconductor device 1. The power is supplied from the terminal PVOUT to the outside the semiconductor device 1. A resistance load RL and a capacitance load CL provided outside the semiconductor device 1 are coupled to the terminal PVOUT. The resistance load RL consumes the supplied power. The capacitance load CL stores the supplied power. The resistance load RL is provided between the terminal PVOUT and a ground voltage. The capacitance load CL is provided in parallel with the resistance load RL between the terminal PVOUT and the ground voltage.

The terminal PEN is a control terminal of the semiconductor device 1. A command CMD is input to the terminal PEN from outside the semiconductor device 1. The command CMD includes a command CMD for causing the semiconductor device 1 to drive the loads and a command CMD for causing the semiconductor device 1 to stop driving of the loads. In the descriptions below, an operation of causing the semiconductor device 1 to drive the loads is also referred to as an on operation. In addition, an operation of causing the semiconductor device 1 to stop driving of the loads is also referred to as an off operation. A command for causing the semiconductor device 1 to drive the loads is also referred to as an on-operation command CMD. In addition, a command for causing the semiconductor device 1 to stop driving of the loads is also referred to as an off-operation command CMD.

The transistors MNO1 and MNO2 are N-channel type MOSFETs. The source of the transistor MNO1 is coupled to the terminal PVIN. The gate of the transistor MNO1 is coupled to the node N1. The source of the transistor MNO2 is coupled to the terminal PVOUT. The gate of the transistor MNO2 is coupled to the node N2. The drain of the transistor MNO2 is coupled to the drain of the transistor MNO1. The drain-to-drain coupling is called, for example, drain common coupling. The transistors MNO1 and MNO2 output the voltage VPS to the terminal PVOUT when the transistors MNO1 and MNO2 are in an on state. The transistors MNO1 and MNO2 do not output the voltage VPS to the terminal PVOUT when the transistors MNO1 and MNO2 are in an off state.

The control circuit 10 controls an overall operation of the semiconductor device 1 to switch between an on operation and an off operation. The control circuit 10 receives a command CMD from outside the semiconductor device 1 via the terminal PEN. The control circuit 10 controls operations of the charge pump circuit 20 and the switching circuits 31, 32, 33, and 34 based on the received command CMD. Specifically, when switching the semiconductor device 1 from an off operation to an on operation, the control circuit 10 couples the switching circuits 31 and 33 and decouples the switching circuits 32 and 34. When switching the semiconductor device 1 from an on operation to an off operation, the control circuit 10 couples the switching circuits 32 and 34 and decouples the switching circuits 31 and 33. The control circuit 10 also includes a timer that counts an elapsed time.

The charge pump circuit 20 generates a voltage VH and outputs the voltage VH to the node N3 under the control of the control circuit 10. The voltage VH is a voltage higher than the voltage VPS by a threshold voltage of the transistors MNO1 and MNO2 or more.

The switching circuit 31 couples or decouples the node N1 to or from the node N3 under the control of the control circuit 10.

The switching circuit 32 couples or decouples the node N1 to or from the terminal PVIN under the control of the control circuit 10.

The switching circuit 33 couples or decouples the node N2 to or from the node N3 under the control of the control circuit 10.

The switching circuit 34 couples or decouples the node N2 to or from the terminal PVOUT under the control of the control circuit 10.

(1-1-2) Configurations of Switching Circuits 31 to 34

The switching circuit 31 includes transistors MP1 and MN1, a resistor R11, and a current source I1. The transistor MP1 is a P-channel type MOSFET. The transistor MN1 is an N-channel type MOSFET.

The source of the transistor MP1 is coupled to the node N3. The drain of the transistor MP1 is coupled to the node N1. One end of the resistor R11 is coupled to the node N3. The gate of the transistor MP1, the other end of the resistor R11, and the drain of the transistor MN1 are coupled together. The gate of the transistor MN1 is coupled to the control circuit 10. The current source I1 is coupled to supply a current from the source of the transistor MN1 to a ground voltage.

A resistance value of the resistor R11 and a current value of the current source I1 are set such that a product of the resistance value of the resistor R11 and the current value of the current source I1 is greater than a magnitude of a threshold voltage of the transistor MP1.

The switching circuit 32 includes transistors MP2 and MN2, and resistors R21, R22, and R23. The transistor MP2 is a P-channel type MOSFET. The transistor MN2 is an N-channel type MOSFET.

The source of the transistor MP2 is coupled to the node N1. The drain of the transistor MP2 is coupled to the terminal PVIN. One end of the resistor R21 is coupled to the node N1. The gate of the transistor MP2, the other end of the resistor R21, and one end of the resistor R22 are coupled together. The other end of the resistor R22, one end of the resistor R23, and the drain of the transistor MN2 are coupled together. The other end of the resistor R23 is grounded. The source of the transistor MN2 is grounded. The gate of the transistor MN2 is coupled to the control circuit 10.

Each of resistance values r21, r22, and r23 is set to satisfy the following formulae (1) and (2).

$$|VH \times (r21)/(r21+r22+r23)| < |Vth(MP2)| \qquad (1)$$

$$|VDIS \times (r21)/(r21+r22)| > |Vth(MP2)| \qquad (2)$$

The resistance values of the resistors R21, R22, and R23 are referred to as r21, r22, and r23, respectively. A threshold voltage of the transistor MP2 is referred to as Vth(MP2). The voltage VDIS is a voltage lower than the voltage VPS and higher than the threshold voltage of the transistor MP2.

The switching circuit 33 includes transistors MP3 and MN3, a resistor R31, and a current source I3. The transistor MP3 is a P-channel type MOSFET. The transistor MN3 is an N-channel type MOSFET.

The source of the transistor MP3 is coupled to the node N3. The drain of the transistor MP3 is coupled to the node N2. One end of the resistor R31 is coupled to the node N3. The gate of the transistor MP3, the other end of the resistor R31, and the drain of the transistor MN3 are coupled together. The gate of the transistor MN3 is coupled to the control circuit 10. The current source I3 is coupled to supply a current from the source of the transistor MN3 to a ground voltage.

A resistance value of the resistor R31 and a current value of the current source I3 are set such that a product of the resistance value of the resistor R31 and the current value of the current source I3 is greater than a magnitude of a threshold voltage of the transistor MP3.

The switching circuit 34 includes transistors MP4 and MN4 and resistors R41, R42, and R43. The transistor MP4 is a P-channel type MOSFET. The transistor MN4 is an N-channel type MOSFET.

The source of the transistor MP4 is coupled to the node N2. The drain of the transistor MP4 is coupled to the terminal PVOUT. One end of the resistor R41 is coupled to the node N2. The gate of the transistor MP4, the other end of the resistor R41, and one end of the resistor R42 are coupled together. The other end of the resistor R42, one end of the resistor R43, and the drain of the transistor MN4 are coupled together. The other end of the resistor R43 is grounded. The source of the transistor MN4 is grounded. The gate of the transistor MN4 is coupled to the control circuit 10.

Each of resistance values r41, r42, and r43 is set to satisfy the following formulae (3) and (4).

$$|VH \times (r41)/(r41+r42+r43)| < |Vth(MP4)| \qquad (3)$$

$$|VDIS \times (r41)/(r41+r42)| > |Vth(MP4)| \qquad (4)$$

The resistance values of the resistors R41, R42, and R43 are referred to as r41, r42, and r43, respectively. A threshold voltage of the transistor MP4 is referred to as Vth(MP4).

Each of the transistors includes a parasitic diode. In FIG. 1, parasitic diodes are illustrated for the transistors MNO1, MNO2, and MP1, and are omitted for the other transistors. In the N-channel type transistors, the parasitic diode is provided such that the anode is coupled to the source and the cathode is coupled to the drain. In the P-channel type transistors, the parasitic diode is provided such that the anode is coupled to the drain and cathode is coupled to the source.

(1-2) Operation

An operation of the semiconductor device 1 will be described. First, operations of the switching circuits 31 to 34 will be described still with reference to FIG. 1.

The operation of the switching circuit 31 will be described. The switching circuit 31 executes a coupling operation or a decoupling operation under the control of the control circuit 10. In the coupling operation of the switching circuit 31, the control circuit 10 applies an "H" level to the gate of the transistor MN1 to turn on the transistor MN1. A current flows from the node N3 to the current source I1 through the resistor R11 and the on-state transistor MN1. This current generates a voltage between the two ends of the resistor R11, and the transistor MP1 is turned on. In this way, in the coupling operation, the switching circuit 31 couples the node N1 to the node N3 by the turned-on transistor MP1.

In the decoupling operation of the switching circuit 31, the control circuit 10 applies an "L" level to the gate of the transistor MN1 to turn off the transistor MN1. With the transistor MN1 in the off state, the current flowing through the resistor R11 is cut off, there is no voltage between the two ends of the resistor R11, and the transistor MP1 turns off. In this way, in the decoupling operation, the switching circuit 31 decouples the node N1 from the node N3 by the turned-off transistor MP1.

The operation of the switching circuit 32 will be described. The switching circuit 32 executes a coupling operation or a decoupling operation under the control of the control circuit 10. In the coupling operation of the switching circuit 32, the control circuit 10 applies an "H" level to the gate of the transistor MN2 to turn on the transistor MN2. Since the turned-on transistor MN2 short-circuits the resistor R23, the gate voltage of the transistor MP2 is a voltage of the node N1 divided by the resistors R21 and R22. From the aforementioned formula (2), if the voltage of the node N1 is equal to or higher than the voltage VDIS, the transistor MP2 is turned on. In this way, in the coupling operation, the switching circuit 32 couples the node N1 to the terminal PVIN by the turned-on transistor MP2.

In the decoupling operation of the switching circuit 32, the control circuit 10 applies an "L" level to the gate of the transistor MN2 to turn off the transistor MN2. With the transistor MN2 in the off state, the gate voltage of the transistor MP2 is a voltage of the node N1 divided by the resistors R21, R22, and R23. From the aforementioned formula (1), if the voltage of the node N1 is equal to or less than the voltage VH, the transistor MP2 is turned off. In this way, in the decoupling operation, the switching circuit 32 decouples the node N1 from the terminal PVIN by the turned-off transistor MP2.

The operation of the switching circuit 33 will be described. The switching circuit 33 executes a coupling operation or a decoupling operation under the control of the control circuit 10. In the coupling operation of the switching circuit 33, the control circuit 10 applies an "H" level to the gate of the transistor MN3 to turn on the transistor MN3. A current flows from the node N3 to the current source 13 through the resistor R31 and the on-state transistor MN3. This current generates a voltage between the two ends of the resistor R31, and the transistor MP3 is turned on. In this way, in the coupling operation, the switching circuit 33 couples the node N2 to the node N3 by the turned-on transistor MP3.

In the decoupling operation of the switching circuit 33, the control circuit 10 applies an "L" level to the gate of the transistor MN3 to turn off the transistor MN3. With the transistor MN3 in the off state, the current flowing through the resistor R31 is cut off, there is no voltage between the two ends of the resistor R31, and the transistor MP3 is turned off. In this way, in the decoupling operation, the switching circuit 33 decouples the node N2 from the node N3 by the turned-off transistor MP3.

The operation of the switching circuit 34 will be described. The switching circuit 34 executes a coupling operation or a decoupling operation under the control of the control circuit 10. In the coupling operation of the switching circuit 34, the control circuit 10 applies an "H" level to the gate of the transistor MN4 to turn on the transistor MN4. Since the turned-on transistor MN4 short-circuits the resistor R43, the gate voltage of the transistor MP4 is a voltage of the node N2 divided by the resistors R41 and R42. From the aforementioned formula (4), if the voltage of the node N2 is equal to or higher than the voltage VDIS, the transistor MP4 is turned on. In this way, in the coupling operation, the switching circuit 34 couples the node N2 to the terminal PVOUT by the turned-on transistor MP4.

In the decoupling operation of the switching circuit 34, the control circuit 10 applies an "L" level to the gate of the transistor MN4 to turn off the transistor MN4. With the transistor MN4 in the off state, the gate voltage of the transistor MP4 is a voltage of the node N2 divided by the resistors R41, R42, and R43. From the aforementioned formula (3), if the voltage of the node N2 is equal to or lower than the voltage VH, the transistor MP4 is turned off. In this way, in the decoupling operation, the switching circuit 34 decouples the node N2 from the terminal PVOUT by the turned-off transistor MP4.

The overall operation of the semiconductor device 1 will be described. The voltage of the node N1 is referred to as VN1. The voltage of the node N2 is referred to as VN2. The voltage of the node N3 is referred to as VN3. The voltage of the terminal PVOUT is referred to as VOUT. The ground voltage GND is 0 V.

Figure 2:
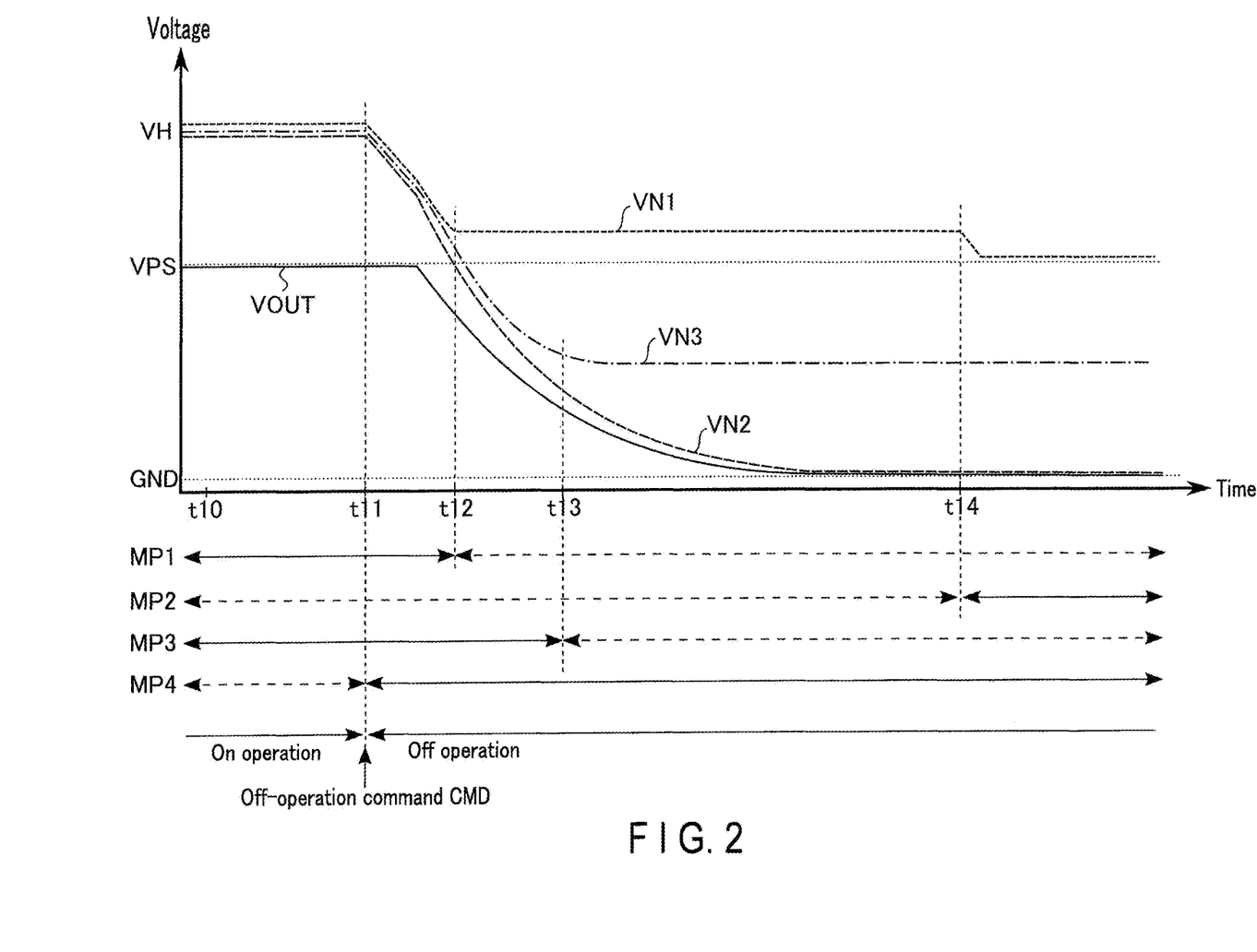
FIG. 2 is a timing chart illustrating an operation example of the semiconductor device according to the first embodiment.

FIG. 2 is a timing chart illustrating an operation example of the semiconductor device 1 according to the first embodiment. FIG. 2 shows how the semiconductor device 1, which is executing an on operation, receives an off-operation command CMD and switches from the on operation to an off operation. FIG. 2 shows the voltages VN1, VN2, VN3, and VOUT. The voltage VN1 is shown as a fine dashed line, the voltage VN2 as a rough dashed line, the voltage VN3 as a single dotted line, and the voltage VOUT as a solid line. FIG. 2 also shows whether the transistors MP1 to MP4 are in an on or off state. A period when each transistor is in the on state is indicated by a solid line, and a period when it is in the off state is indicated by a dashed line.

At time t10, the semiconductor device 1 is executing the on operation. In the on operation of the semiconductor device 1, the control circuit 10 causes the charge pump circuit 20 to output the voltage VH. As a result, the voltage VN3 becomes the voltage VH. In the on operation of the semiconductor device 1, the control circuit 10 causes the switching circuits 31 and 33 to execute a coupling operation and the switching circuits 32 and 34 to execute a decoupling operation. As a result, the transistors MP1 and MP3 are turned on and the transistors MP2 and MP4 are turned off. Thus, the nodes N1 and N2 are respectively coupled to the node N3, and the voltages VN1 and VN2 become the voltage VH. Since the voltage of the terminal PVIN is the voltage VPS and the voltages VN1 and VN2 are the voltage VH, the transistors MNO1 and MNO2 are turned on and the voltage VPS is output from the terminal PVIN to the terminal PVOUT. Thus, the voltage VOUT becomes the voltage VPS.

At time t11, the semiconductor device 1 receives the off-operation command CMD and starts the off operation. In the off operation of the semiconductor device 1, the control circuit 10 causes the charge pump circuit 20 to stop outputting the voltage VH. In the off operation of the semiconductor device 1, the control circuit 10 causes the switching circuits 31 and 33 to start a decoupling operation, the switching circuit 34 to start a coupling operation, and the timer to start counting.

The switching circuits 31 and 33 start the decoupling operation, but the transistors MP1 and MP3 maintain the on state for a while. This is because of the reason described below. The transistor MP1 includes a gate-to-drain capacitance. When the current flowing through this gate-to-drain capacitance passes through the resistor R11, a voltage drop occurs. This voltage drop keeps the transistor MP1 on. Similarly, the transistor MP3 includes a gate-to-drain capacitance. When the current flowing through this gate-to-drain capacitance passes through the resistor R31, a voltage drop occurs. This voltage drop keeps the transistor MP3 on. Thus, even after the switching circuits 31 and 33 start the decoupling operation, the transistors MP1 and MP3 maintain the on state for a while.

The switching circuit 34 starts the coupling operation, and the transistor MP4 is turned on. Therefore, at time t11, the transistors MP1, MP3, and MP4 are in the on state.

Through the on-state transistors MP1, MP3, and MP4, the voltages of the nodes N1, N2, and N3 are discharged to the terminal PVOUT. Therefore, after time t11, the voltages VN1, VN2, and VN3 decrease from the voltage VH.

As the voltages VN1 and VN2 decrease and become lower than a sum of the voltage VPS and a threshold voltage of the transistor MNO1 or MNO2, the transistors MNO1 and MNO2 are turned off. When the transistors MNO1 and MNO2 are in the off state, the voltage VOUT decreases.

At time t12, the transistor MP1 switches from the on state to the off state. This causes the node N1 to be decoupled from the node N3, and the voltage VN1 stops decreasing. After time t12, the voltages VN2, VN3, and VOUT continue to decrease.

At time t13, the transistor MP3 switches from the on state to the off state. This causes the node N3 to be decoupled from the node N2, and the voltage VN3 stops decreasing. After time t13, the voltages VN2 and VOUT continue to decrease and eventually reach 0 V.

At time t14, the control circuit 10 terminates the timer count, and causes the switching circuit 32 to start a coupling operation. The switching circuit 32 starts the coupling operation, and the transistor MP2 is turned on. As a result, the node N1 and the terminal PVIN are coupled together, and the voltage of the node N1 is discharged to the terminal PVIN. The voltage VN1 decreases to the voltage VPS after time t14.

(1-3) Advantageous Effect

With the semiconductor device 1 according to the first embodiment described above, the output voltage can be reduced to 0 V in a short time in an off operation. Details of an advantageous effect of the semiconductor device 1 according to the first embodiment will be described below.

In the semiconductor device 1 according to the first embodiment, the control circuit 10 uses the timer to manage the timing for causing the switching circuit 32 to start a coupling operation. Here, a comparative example is described, involving a control circuit that causes the switching circuit 32 to start a coupling operation upon receipt of an off-operation command CMD, without timing management by a timer.

Figure 3:
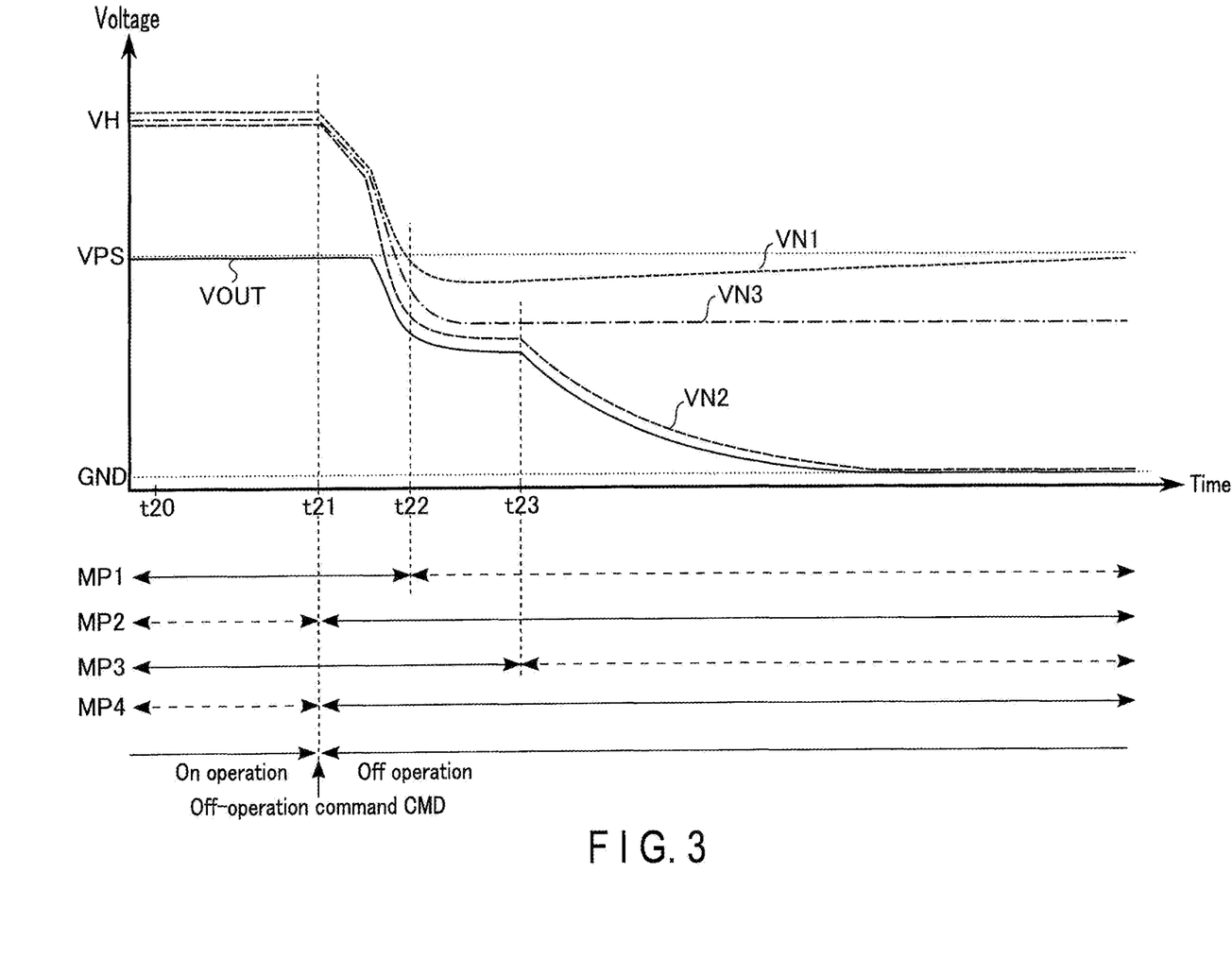
FIG. 3 is a timing chart illustrating an operation example of a semiconductor device according to a comparative example.

A semiconductor device 1a according to the comparative example differs from the semiconductor device according to the first embodiment in that a control circuit 10a does not perform timing management by a timer. FIG. 3 is a timing chart illustrating an operation example of the semiconductor device according to the comparative example. FIG. 3 shows how the semiconductor device 1a, which is executing an on operation, receives an off-operation command CMD and switches from the on operation to an off operation. FIG. 3 shows the voltages VN1, VN2, VN3, and VOUT. The voltage VN1 is shown as a fine dashed line, the voltage VN2 as a rough dashed line, the voltage VN3 as a single dotted line, and the voltage VOUT as a solid line. FIG. 3 also shows whether the transistors MP1 to MP4 are in the on or off state. A period when each transistor is in the on state is indicated by a solid line, and a period when it is in the off state is indicated by a dashed line.

At time t20, the semiconductor device 1a is executing the on operation. The on operation of the semiconductor device 1a is similar to that of the semiconductor device 1.

At time t21, the semiconductor device 1a receives the off-operation command CMD and starts the off operation. In the off operation of the semiconductor device 1a, the control circuit 10a causes the charge pump circuit 20 to stop outputting the voltage VH. In the off operation of the semiconductor device 1a, the control circuit 10a causes the switching circuits 31 and 33 to start a decoupling operation and the switching circuits 32 and 34 to start a coupling operation.

Similar to the semiconductor device 1, in the semiconductor device 1a, the transistors MP1 and MP3 maintain the on state for a while even after the switching circuits 31 and 33 start the decoupling operation.

The switching circuits 32 and 34 start the coupling operation, and the transistors MP2 and MP4 are turned on. Therefore, at time t21, the transistors MP1, MP2, MP3, and MP4 are in the on state.

Through the on-state transistors MP1, MP2, MP3, and MP4, the voltages of the nodes N1, N2, and N3 are discharged to the terminals PVOUT and PVIN. Therefore, after time t21, the voltages VN1, VN2, and VN3 decrease from the voltage VH.

As the voltages VN1 and VN2 decrease and become lower than a sum of the voltage VPS and the threshold voltage of the transistor MNO1 or MNO2, the transistors MNO1 and MNO2 are turned off. When the transistors MNO1 and MNO2 are in the off state, the voltage VOUT decreases.

At time t22, the transistor MP1 switches from the on state to the off state. This causes the node N1 to be decoupled from the node N3, and the voltage VN1 stops decreasing.

From time t22 to time t23, the voltages VN2, VN3, and VOUT stabilize at a voltage lower than the voltage VPS. This is due to the fact that the transistors MP2, MP3, and MP4 are in the on state. Specifically, this is due to the fact that the power supply PS charges the capacitance load CL via the on-state transistor MP2, the parasitic diode of the transistor MP1, the on-state transistor MP3, and the on-state transistor MP4.

At time t23, the transistor MP3 switches from the on state to the off state. This causes the node N2 to be decoupled from the node N3, cutting off the path for the power supply PS to charge the capacitance load CL. As a result, after time t23, the voltage VN3 maintains its value, while the voltages VN2 and VOUT decrease to 0 V.

Thus, in the semiconductor device 1a according to the comparative example without timing control by a timer, when the off operation is started, a period during which the power supply PS charges the capacitance load CL in the path through the switching circuits 31, 32, 33, and 34 occurs. During the period when the power supply PS is charging the capacitance load CL, the voltage VOUT stops decreasing. Thus, a time required for the voltage VOUT to decrease to 0 V is long.

In contrast, in the semiconductor device 1 according to the first embodiment, the timing for turning on the transistor MP2 is managed by the timer. The timer causes the transistor MP2 to switch from the off state to the on state after the transistors MP1 and MP3 are turned off. Thus, the power supply PS is restrained from charging the capacitance load CL in the path through the switching circuits 31, 32, 33, and 34. As a result, in the semiconductor device 1 according to the first embodiment, the voltage VOUT decreases to 0 V without stagnating at a specific voltage. Therefore, the semiconductor device 1 according to the first embodiment requires only a short time for the voltage VOUT to decrease to 0 V, and the output voltage can be reduced to 0 V in a short time.

In addition, in the semiconductor device 1 according to the first embodiment, the power supply PS is restrained from charging the capacitance load CL in the path through the switching circuits 31, 32, 33, and 34. This prevents deterioration and damage to the circuit due to a charging current.

(2) Second Embodiment

A configuration of a semiconductor device according to a second embodiment differs from that of the semiconductor device according to the first embodiment in the configuration of the switching circuit and the operation of the control circuit. A description will be given below of differences in the semiconductor device 1b according to the second embodiment from the first embodiment.

(2-1) Configuration (2-1-1) Configuration of Semiconductor Device 1b

Figure 4:
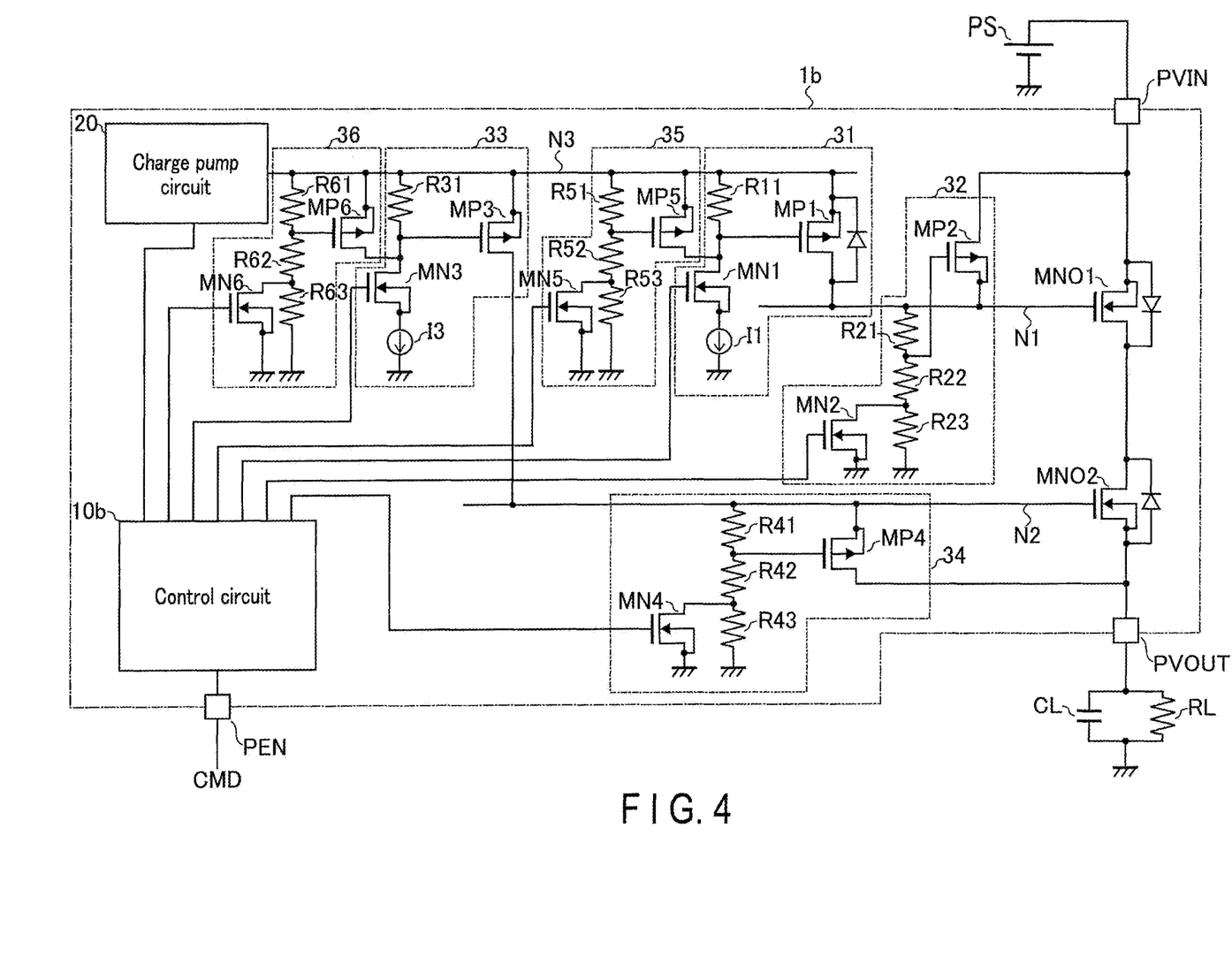
FIG. 4 is a circuit diagram for explaining an example of a configuration of a semiconductor device according to a second embodiment.

FIG. 4 is a circuit diagram for explaining an example of the configuration of the semiconductor device according to the second embodiment. In the semiconductor device 1b according to the second embodiment, the control circuit 10 of the semiconductor device 1 described in the first embodiment is replaced with a control circuit 10b and further includes switching circuits 35 and 36.

The control circuit 10b controls an overall operation of the semiconductor device 1b to switch between an on operation and an off operation. The control circuit 10b receives a command CMD from outside the semiconductor device 1b via the terminal PEN. The control circuit 10b controls operations of the charge pump circuit 20 and the switching circuits 31, 32, 33, 34, 35, and 36 based on the received command CMD. Specifically, when switching the semiconductor device 1b from an off operation to an on operation, the control circuit 10b couples the switching circuits 31 and 33 and decouples the switching circuits 32, 34, 35, and 36. When switching the semiconductor device 1b from an on operation to an off operation, the control circuit 10b couples the switching circuits 32, 34, 35, and 36 and decouples the switching circuits 31 and 33.

The switching circuit 35 couples or decouples between one end and the other end of the resistor R11 under the control of the control circuit 10b.

The switching circuit 36 couples or decouples between one end and the other end of the resistor R31 under the control of the control circuit 10b.

The switching circuit 35 includes transistors MP5 and MN5, and resistors R51, R52, and R53. The transistor MP5 is a P-channel type MOSFET. The transistor MN5 is an N-channel type MOSFET.

The source of the transistor MP5 is coupled to the node N3. The drain of the transistor MP5 is coupled to the gate of the transistor MP1. One end of the resistor R51 is coupled to the node N3. The gate of the transistor MP5, the other end of the resistor R51, and one end of the resistor R52 are coupled together. The other end of the resistor R52, one end of the resistor R53, and the drain of the transistor MN5 are coupled together. The other end of the resistor R53 is grounded. The source of the transistor MN5 is grounded. The gate of the transistor MN5 is coupled to the control circuit 10b.

Each of resistance values r51, r52, and r53 is set to satisfy the following formulae (5) and (6).

$$|VH \times (r51)/(r51+r52+r53)| < |Vth(MP5)| \qquad (5)$$

$$|VDIS \times (r51)/(r51+r52)| > |Vth(MP5)| \qquad (6)$$

The resistance values of the resistors R51, R52, and R53 are referred to as r51, r52, and r53, respectively. A threshold voltage of the transistor MP5 is referred to as Vth(MP5).

The switching circuit 36 includes transistors MP6 and MN6, and resistors R61, R62, and R63. The transistor MP6 is a P-channel type MOSFET. The transistor MN6 is an N-channel type MOSFET.

The source of the transistor MP6 is coupled to the node N3. The drain of the transistor MP6 is coupled to the gate of the transistor MP3. One end of the resistor R61 is coupled to the node N3. The gate of the transistor MP6, the other end of the resistor R61, and one end of the resistor R62 are coupled together. The other end of the resistor R62, one end of the resistor R63, and the drain of the transistor MN6 are coupled together. The other end of the resistor R63 is grounded. The source of the transistor MN6 is grounded. The gate of the transistor MN6 is coupled to the control circuit 10b.

Each of resistance values r61, r62, and r63 is set to satisfy the following formulae (7) and (8).

$$|VH \times (r61)/(r61+r62+r63)| < |Vth(MP6)| \qquad (7)$$

$$|VDIS \times (r61)/(r61+r62)| > |Vth(MP6)| \qquad (8)$$

The resistance values of the resistors R61, R62, and R63 are referred to as r61, r62, and r63, respectively. A threshold voltage of the transistor MP6 is referred to as Vth(MP6).

The other configurations of the semiconductor device 1b according to the second embodiment are the same as those of the semiconductor device 1 according to the first embodiment.

(2-2) Operation

An operation of the semiconductor device 1b will be described. First, operations of the switching circuits 35 and 36 will be described still with reference to FIG. 4.

The operation of the switching circuit 35 will be described. The switching circuit 35 executes a coupling operation or a decoupling operation under the control of the control circuit 10b. In the coupling operation of the switching circuit 35, the control circuit 10b applies an "H" level to the gate of the transistor MN5 to turn on the transistor MN5. Since the turned-on transistor MN5 short-circuits the resistor R53, the gate voltage of the transistor MP5 is a voltage of the node N3 divided by the resistors R51 and R52. From the aforementioned formula (6), if the voltage of the node N3 is equal to or higher than the voltage VDIS, the transistor MP5 is turned on. In this way, in the coupling operation, the switching circuit 35 couples the source to the gate of the transistor MP1 by the turned-on transistor MP5.

In the decoupling operation of the switching circuit 35, the control circuit 10b applies an "L" level to the gate of the transistor MN5 to turn off the transistor MN5. With the transistor MN5 in the off state, the gate voltage of the transistor MP5 is a voltage of the node N3 divided by the resistors R51, R52, and R53. From the aforementioned formula (5), if the voltage of the node N3 is equal to or lower than the voltage VH, the transistor MP5 is turned off. In this way, in the decoupling operation, the switching circuit 35 decouples the source from the gate of the transistor MP1 by the turned-off transistor MP5.

The operation of the switching circuit 36 will be described. The switching circuit 36 executes a coupling operation or a decoupling operation under the control of the control circuit 10b. In the coupling operation of the switching circuit 36, the control circuit 10b applies an "H" level to the gate of the transistor MN6 to turn on the transistor MN6. Since the turned-on transistor MN6 short-circuits the resistor R63, the gate voltage of the transistor MP6 is a voltage of the node N3 divided by the resistors R61 and R62. From the aforementioned formula (8), if the voltage of the node N3 is equal to or higher than the voltage VDIS, the transistor MP6 is turned on. In this way, in the coupling operation, the switching circuit 36 couples the source to the gate of the transistor MP3 by the turned-on transistor MP6.

In the decoupling operation of the switching circuit 36, the control circuit 10b applies an "L" level to the gate of the transistor MN6 to turn off the transistor MN6. With the transistor MN6 in the off state, the gate voltage of the transistor MP6 is a voltage of the node N3 divided by the resistors R61, R62, and R63. From the aforementioned formula (7), if the voltage of the node N3 is equal to or lower than the voltage VH, the transistor MP6 is turned off. In this way, in the decoupling operation, the switching circuit 36 decouples the source from the gate of the transistor MP3 by the turned-off transistor MP6.

An overall operation of the semiconductor device 1b will be described.

Figure 5:
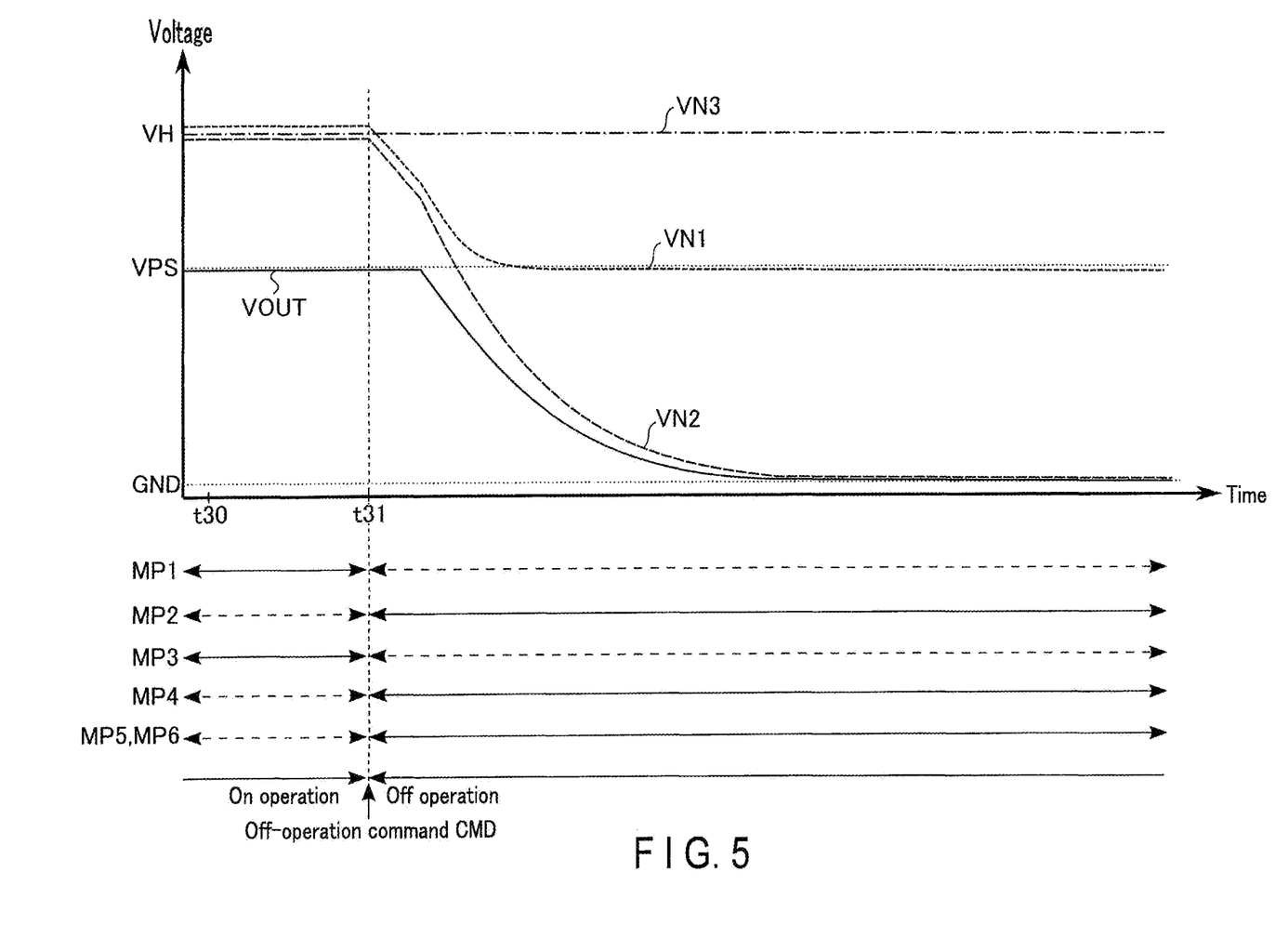
FIG. 5 is a timing chart illustrating an operation example of the semiconductor device according to the second embodiment.

FIG. 5 is a timing chart illustrating an operation example of the semiconductor device according to the second embodiment. FIG. 5 shows how the semiconductor device 1b, which is executing an on operation, receives an off-operation command CMD and switches from the on operation to an off operation. FIG. 5 shows the voltages VN1, VN2, VN3, and VOUT. The voltage VN1 is shown as a fine dashed line, the voltage VN2 as a rough dashed line, the voltage VN3 as a single dotted line, and the voltage VOUT as a solid line. FIG. 5 also shows whether the transistors MP1 to MP6 are in the on or off state. A period when each transistor is in the on state is indicated by a solid line, and a period when it is in the off state is indicated by a dashed line.

At time t30, the semiconductor device 1b is executing the on operation. In the on operation of the semiconductor device 1b, the control circuit 10b causes the charge pump circuit 20 to output the voltage VH. As a result, the voltage VN3 becomes the voltage VH. In the on operation of the semiconductor device 1b, the control circuit 10b causes the switching circuits 31 and 33 to execute a coupling operation and the switching circuits 32, 34, 35, and 36 to execute a decoupling operation. As a result, the transistors MP1 and MP3 are turned on and the transistors MP2 and MP4 are turned off. Thus, the nodes N1 and N2 are respectively coupled to the node N3, and the voltages VN1 and VN2 become the voltage VH. Since the voltage of the terminal PVIN is the voltage VPS and the voltages VN1 and VN2 are the voltage VH, the transistors MNO1 and MNO2 are turned on and the voltage VPS is output from the terminal PVIN to the terminal PVOUT. Thus, the voltage VOUT becomes the voltage VPS.

At time t31, the semiconductor device 1b receives the off-operation command CMD and starts the off operation. In the off operation of the semiconductor device 1b, the control circuit 10b causes the charge pump circuit 20 to stop outputting the voltage VH. In the off operation of the semiconductor device 1b, the control circuit 10b causes the switching circuits 31 and 33 to start a decoupling operation and the switching circuits 32, 34, 35, and 36 to start a coupling operation.

The transistor MP1 is immediately turned off as the switching circuit 31 starts the decoupling operation and the switching circuit 35 starts the coupling operation. Specifically, the turned-on transistor MP5 short-circuits the gate and source of the transistor MP1, thereby turning the transistor MP1 to the off state. Similarly, the transistor MP3 is immediately turned off as the switching circuit 33 executes the decoupling operation and the switching circuit 36 executes the coupling operation. Specifically, the turned-on transistor MP6 short-circuits the gate and source of the transistor MP3, thereby turning the transistor MP3 to the off state.

The switching circuits 32 and 34 also start the coupling operation, and the transistors MP2 and MP4 are turned on. Therefore, at time t31, the transistors MP2, MP4, MP5, and MP6 are in the on state.

Through the on-state transistor MP2, the voltage of the node N1 is discharged to the terminal PVIN. Therefore, after time t31, the voltage VN1 decreases to the voltage VPS.

Through the on-state transistor MP4, the voltage of the node N2 is discharged to the terminal PVOUT. Therefore, after time t31, the voltage VN2 decreases to 0 V.

Since the transistors MP1 and MP3 are in the off state, the voltage VN3 maintains the voltage VH.

As the voltages VN1 and VN2 decrease and become lower than a sum of the voltage VPS and the threshold voltage of the transistor MNO1 or MNO2, the transistors MNO1 and MNO2 are turned off. When the transistors MNO1 and MNO2 are in the off state, the voltage VOUT decreases to 0 V.

(2-3) Advantageous Effect

With the semiconductor device 1b according to the second embodiment described above, the output voltage can be reduced to 0 V in a short time in an off operation. Details of an advantageous effect of the semiconductor device 1b according to the second embodiment will be described below.

The semiconductor device 1b according to the second embodiment includes the switching circuits 35 and 36. In the off operation of the semiconductor device 1b, the switching circuits 35 and 36 immediately turn the transistors MP1 and MP3 to an off state by short-circuiting the gate and source of the transistors MP1 and MP4. Thus, the power supply PS is restrained from charging the capacitance load CL in the path through the switching circuits 31, 32, 33, and 34. As a result, in the semiconductor device 1b according to the second embodiment, the voltage VOUT decreases to 0 V without stagnating at a specific voltage. Therefore, the semiconductor device 1b according to the second embodiment requires only a short time for the voltage VOUT to decrease to 0 V, and the output voltage can be reduced to 0 V in a short time.

In addition, in the semiconductor device 1b according to the second embodiment, the power supply PS is restrained from charging the capacitance load CL in the path through the switching circuits 31, 32, 33, and 34. This prevents deterioration and damage to the circuit due to a charging current.

(3) Third Embodiment

A configuration of a semiconductor device according to a third embodiment differs from that of the semiconductor device according to the first embodiment in the configuration of the switching circuit and the operation of the control circuit. A description will be given below of differences in the semiconductor device 1c according to the third embodiment from the first embodiment.

(3-1) Configuration (3-1-1) Configuration of Semiconductor Device 1c

Figure 6:
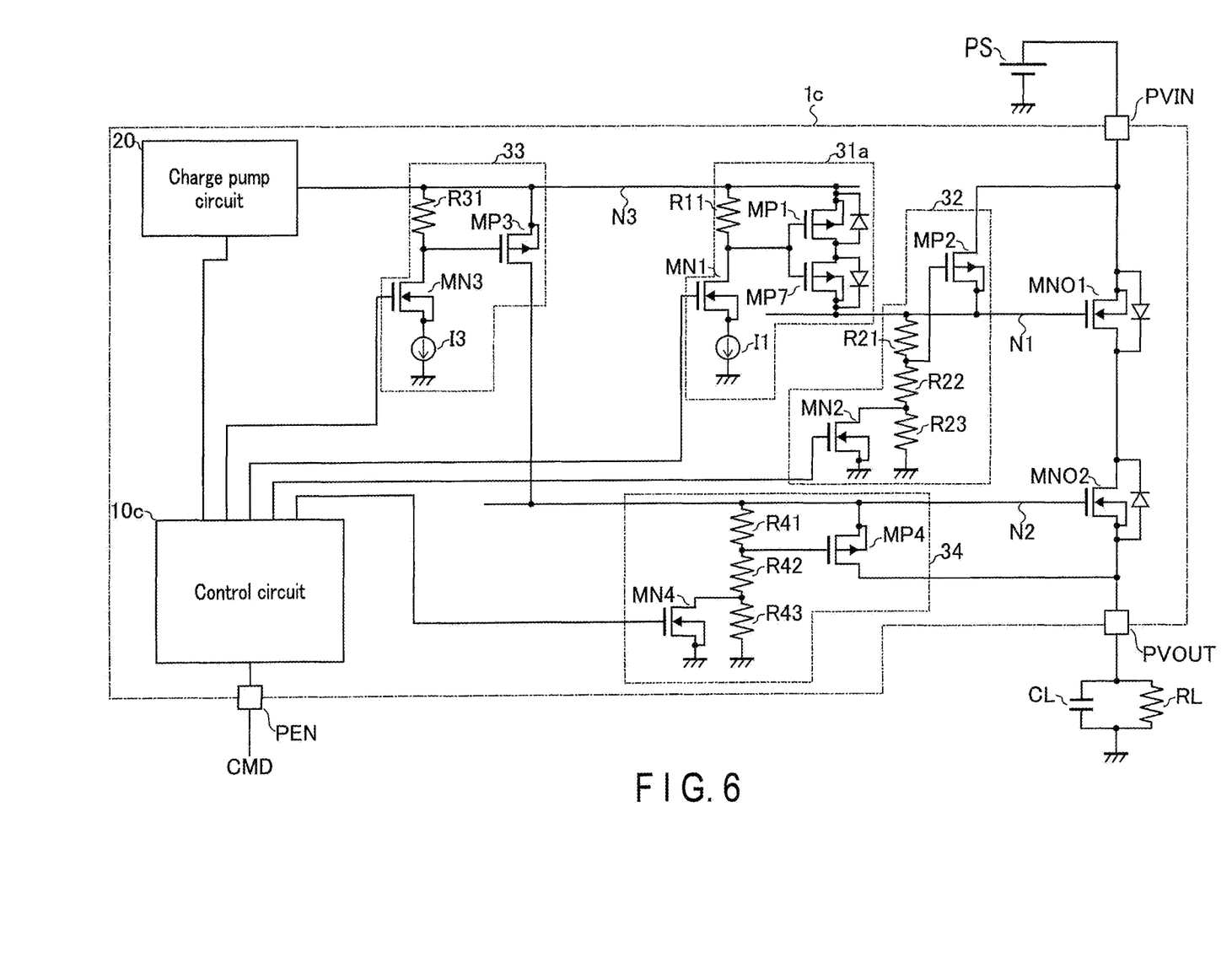
FIG. 6 is a circuit diagram for explaining an example of a configuration of a semiconductor device according to a third embodiment.

FIG. 6 is a circuit diagram for explaining an example of the configuration of the semiconductor device according to the third embodiment. The semiconductor device 1c according to the third embodiment has a configuration in which the control circuit 10 of the semiconductor device 1 described in the first embodiment is replaced with a control circuit 10c and the switching circuit 31 is replaced with a switching circuit 31a.

The control circuit 10c controls an overall operation of the semiconductor device 1c to switch between an on operation and an off operation. The control circuit 10c receives a command CMD from outside the semiconductor device 1c via the terminal PEN. The control circuit 10c controls operations of the charge pump circuit 20 and the switching circuits 31a, 32, 33, and 34 based on the received command CMD. Specifically, when switching the semiconductor device 1c from an off operation to an on operation, the control circuit 10c couples the switching circuits 31a and 33 and decouples the switching circuits 32 and 34. When switching the semiconductor device 1c from an on operation to an off operation, the control circuit 10c couples the switching circuits 32 and 34 and decouples the switching circuits 31a and 33.

The switching circuit 31a couples or decouples between the node N1 and the node N3 under the control of the control circuit 10c.

The switching circuit 31a includes transistors MP1, MP7, and MN1, a resistor R11, and a current source I1. The transistors MP1 and MP7 are P-channel type MOSFETs. The transistor MN1 is an N-channel type MOSFET.

The source of the transistor MP1 is coupled to the node N3. The drain of the transistor MP1 is coupled to the drain of the transistor MP7. The source of the transistor MP7 is coupled to the node N1. One end of the resistor R11 is coupled to the node N3. The gate of the transistor MP1, the gate of the transistor MP7, the other end of the resistor R11, and the drain of the transistor MN1 are coupled together. The gate of the transistor MN1 is coupled to the control circuit 10c. The current source I1 is coupled to supply a current from the source of the transistor MN1 to the ground voltage.

A resistance value of the resistor R11 and a current value of the current source I1 are set such that a product of the resistance value of the resistor R11 and the current value of the current source I1 is greater than a magnitude of a threshold voltage of the transistor MP1 or a magnitude of a threshold voltage of the transistor MP7.

The other configurations of the semiconductor device 1c according to the third embodiment are the same as those of the semiconductor device 1 according to the first embodiment.

(3-2) Operation

An operation of the semiconductor device 1c will be described.

First, an operation of the switching circuit 31a will be described still with reference to FIG. 6. The switching circuit 31a executes a coupling operation or a decoupling operation under the control of the control circuit 10c. In the coupling operation of the switching circuit 31a, the control circuit 10c applies an "H" level to the gate of the transistor MN1 to turn on the transistor MN1. A current flows from the node N3 to the current source I1 through the resistor R11 and the on-state transistor MN1. This current generates a voltage between the two ends of the resistor R11, and the transistors MP1 and MP7 are turned on. In this way, in the coupling operation, the switching circuit 31a couples the node N1 to the node N3 by the turned-on transistors MP1 and MP7.

In the decoupling operation of the switching circuit 31a, the control circuit 10c applies an "L" level to the gate of the transistor MN1 to turn off the transistor MN1. With the transistor MN1 in the off state, the current flowing through the resistor R11 is cut off, there is no voltage between the two ends of the resistor R11, and the transistors MP1 and MP7 turn off. In this way, in the decoupling operation, the switching circuit 31a decouples the node N1 from the node N3 by the turned-off transistors MP1 and MP7.

An overall operation of the semiconductor device 1c will be described.

Figure 7:
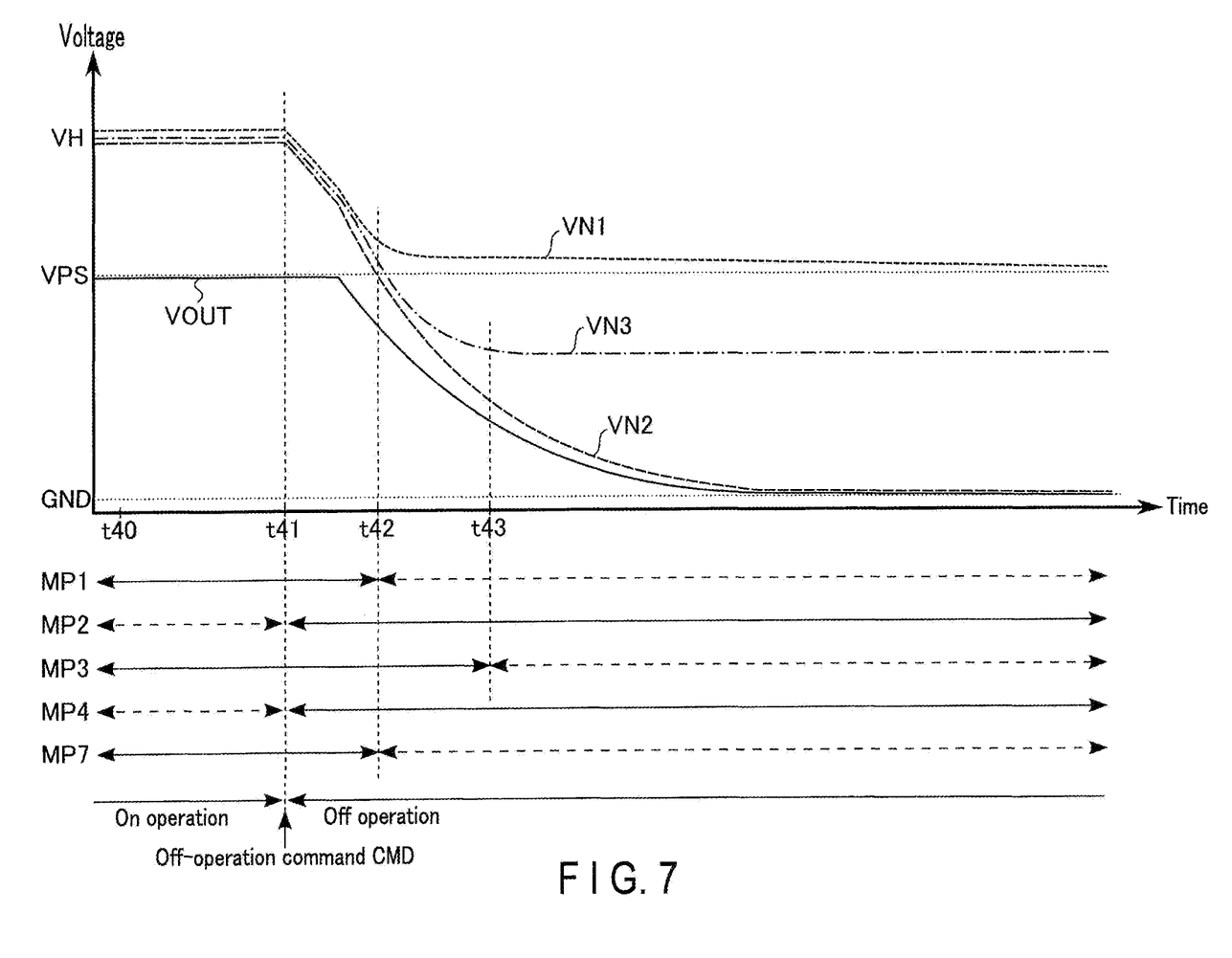
FIG. 7 is a timing chart illustrating an operation example of the semiconductor device according to the third embodiment.

FIG. 7 is a timing chart illustrating an operation example of the semiconductor device according to the third embodiment. FIG. 7 shows how the semiconductor device 1c, which is executing an on operation, receives an off-operation command CMD and switches from the on operation to an off operation. FIG. 7 shows the voltages VN1, VN2, VN3, and VOUT. The voltage VN1 is shown as a fine dashed line, the voltage VN2 as a rough dashed line, the voltage VN3 as a single dotted line, and the voltage VOUT as a solid line. FIG. 7 also shows whether the transistors MP1, MP2, MP3, MP4, and MP7 are in the on or off state. A period when each transistor is in the on state is indicated by a solid line, and a period when it is in the off state is indicated by a dashed line.

At time t40, the semiconductor device 1c is executing the on operation. In the on operation of the semiconductor device 1c, the control circuit 10c causes the charge pump circuit 20 to output the voltage VH. As a result, the voltage VN3 becomes the voltage VH. In the on operation of the semiconductor device 1c, the control circuit 10c causes the switching circuits 31*a* and 33 to execute a coupling operation and the switching circuits 32 and 34 to execute a decoupling operation. As a result, the transistors MP1, MP7, and MP3 are turned on and the transistors MP2 and MP4 are turned off. Thus, the nodes N1 and N2 are respectively coupled to the node N3, and the voltages VN1 and VN2 become the voltage VH. Since the voltage of the terminal PVIN is the voltage VPS and the voltages VN1 and VN2 are the voltage VH, the transistors MNO1 and MNO2 are turned on and the voltage VPS is output from the terminal PVIN to the terminal PVOUT. Thus, the voltage VOUT becomes the voltage VPS.

At time t41, the semiconductor device 1*c* receives the off-operation command CMD and executes the off operation. In the off operation of the semiconductor device 1*c*, the control circuit 10*c* causes the charge pump circuit 20 to stop outputting the voltage VH. In the off operation of the semiconductor device 1*c*, the control circuit 10*c* causes the switching circuits 31*a* and 33 to start a decoupling operation and the switching circuits 32 and 34 to start a coupling operation.

Similar to the semiconductor device 1, in the semiconductor device 1*c*, the transistors MP1, MP7, and MP3 maintain the on state for a while even after the switching circuits 31*a* and 33 start the decoupling operation.

The switching circuits 32 and 34 start the coupling operation, and the transistors MP2 and MP4 are turned on. Therefore, at time t41, the transistors MP1, MP2, MP3, MP4, and MP7 are in the on state.

Through the on-state transistors MP1, MP2, MP3, MP4, and MP7, the voltages of the nodes N1, N2, and N3 are discharged to the terminals PVOUT and PVIN. Therefore, after time t41, the voltages VN1, VN2, and VN3 decrease from the voltage VH.

As the voltages VN1 and VN2 decrease and become lower than a sum of the voltage VPS and the threshold voltage of the transistor MNO1 or MNO2, the transistors MNO1 and MNO2 are turned off. When the transistors MNO1 and MNO2 are in the off state, the voltage VOUT decreases.

At time t42, the transistors MP1 and MP7 switch from the on state to an off state. This causes the node N1 to be decoupled from the node N3. Since the parasitic diode of the transistor MP1 and the parasitic diode of the transistor MP7 are coupled in opposite directions, no current through the parasitic diodes of the transistors MP1 and MP7 is generated.

At time t43, the transistor MP3 switches from the on state to an off state. This causes the node N3 to be decoupled from the node N2, and the voltage VN3 stops decreasing. Thereafter, the voltage VN3 maintains its value, and the voltages VN2 and VOUT continue to decrease to 0 V.

(3-3) Advantageous Effect

With the semiconductor device 1*c* according to the third embodiment described above, the output voltage can be reduced to 0 V in a short time in an off operation. Details of an advantageous effect of the semiconductor device 1*c* according to the third embodiment will be described below.

The semiconductor device 1*c* according to the third embodiment includes the switching circuit 31*a*. The transistors MP1 and MP7, which are coupled in series so that the parasitic diodes are in opposite directions, suppress current flow through these parasitic diodes. Thus, the power supply PS is restrained from charging the capacitance load CL in the path through the switching circuits 31*a*, 32, 33, and 34. As a result, in the semiconductor device 1*c* according to the third embodiment, the voltage VOUT decreases to 0 V without stagnating at a specific voltage. Therefore, the semiconductor device 1*c* according to the third embodiment requires only a short time for the voltage VOUT to decrease to 0 V, and the output voltage can be reduced to 0 V in a short time.

In addition, in the semiconductor device 1*c* according to the third embodiment, the power supply PS is restrained from charging the capacitance load CL in the path through the switching circuits 31*a*, 32, 33, and 34. This prevents deterioration and damage to the circuit due to a charging current.

(4) Modification, Etc.

Figure 8:
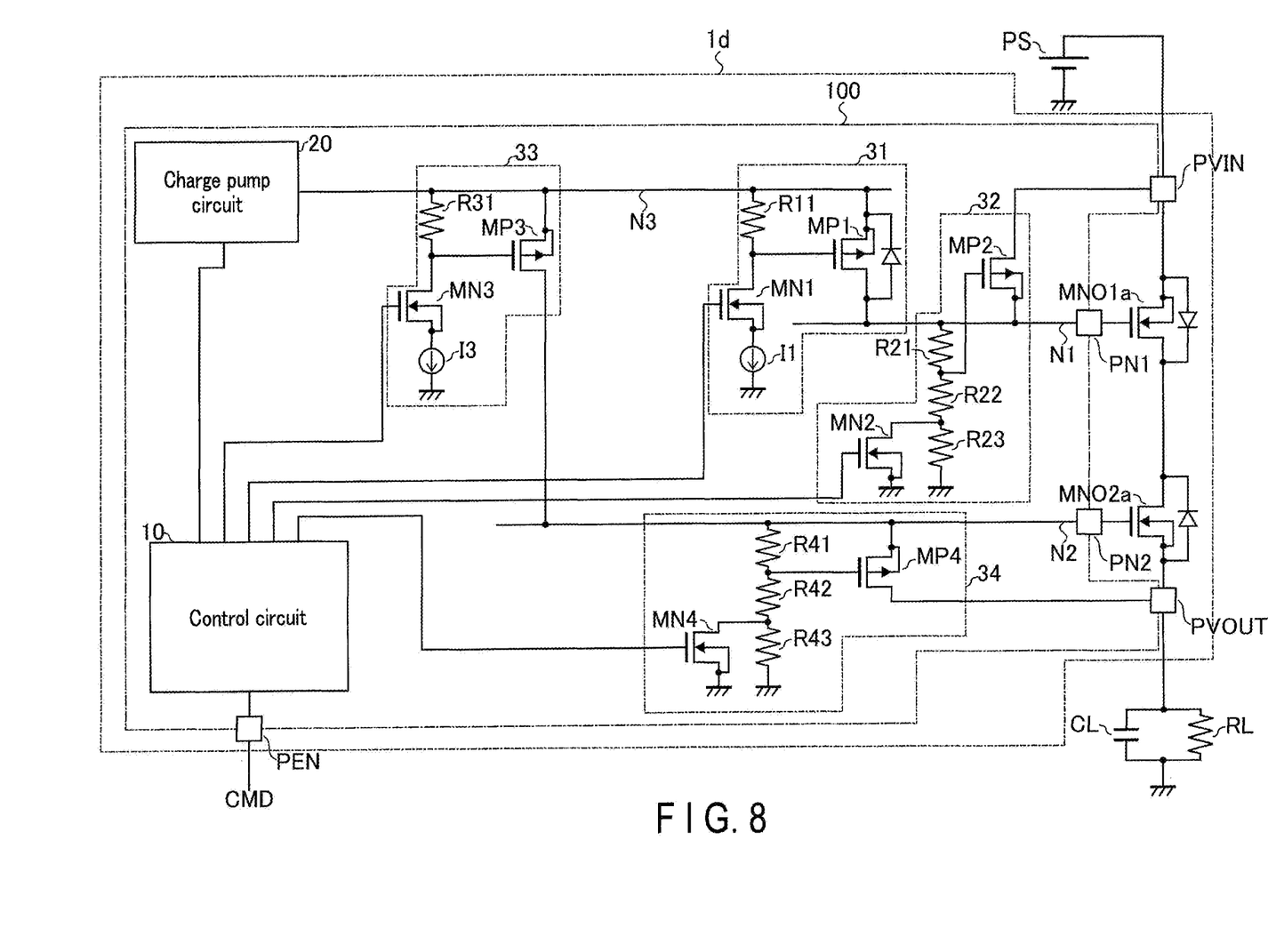
FIG. 8 is a circuit diagram for explaining an example of a configuration of a semiconductor device according to a modification.

The foregoing embodiments have assumed the instances where the semiconductor device, which is a load switch, is formed into a single IC chip. The load switch may be formed by a combination of multiple components, e.g., a gate driver IC chip and a package of transistors. FIG. 8 is a circuit diagram for explaining an example of a configuration of a semiconductor device according to a modification. A semiconductor device 1*d* is a load switch that supplies power to loads. The semiconductor device 1*d* includes a semiconductor device 100 and transistors MNO1*a* and MNO2*a*.

The semiconductor device 100 is a gate driver that drives the gate of each of the transistors MNO1*a* and MNO2*a*. The semiconductor device 100 is, for example, an IC chip. The semiconductor device 100 has a configuration that does not include the transistors MNO1 and MNO2 and further includes terminals PN1 and PN2, with respect to the semiconductor device 1 described in the first embodiment. The terminals PN1 and PN2 are output terminals of the semiconductor device 100. The terminal PN1 is coupled to the node N1. The terminal PN2 is coupled to the node N2. The other configurations of the semiconductor device 100 are the same as those of the semiconductor device 1 described in the first embodiment.

Each of the transistors MNO1*a* and MNO2*a* is an N-channel type MOSFET. The transistors MNO1*a* and MNO2*a* are, for example, semiconductor elements in a package independent of the semiconductor device 100. The source of the transistor MNO1*a* is coupled to the terminal PVIN. The gate of the transistor MNO1*a* is coupled to the terminal PN1. The drain of the transistor MNO2*a* is coupled to the drain of the transistor MNO1*a*. The source of the transistor MNO2*a* is coupled to the terminal PVOUT. The gate of the transistor MNO2*a* is coupled to the terminal PN2.

In this way, even if the load switch is formed by combining multiple components, the same effects as in the above embodiments can be obtained.

In the above embodiments, the case including a capacitance load and a resistance load as loads to which the semiconductor device supplies power is described as an example. The configuration of the loads to which the semiconductor device supplies power is not limited to the examples shown in the above embodiments. The loads to which the semiconductor device supplies power may be, for example, an information processing terminal such as a personal computer or smartphone, and a battery charging device.

In this specification, a "first end of a switch element" corresponds to the source or drain of a MOSFET. A "second end of a switch element" corresponds to the drain or source of a MOSFET.

The term "couple" refers to electrical coupling, and does not exclude interposition of another component. In addition, "electrical coupling" may be performed via an insulator, if the same operation is ensured thereby. The term "on state" refers to a state in which the gate of a relevant transistor is applied with a voltage equal to or higher than a threshold voltage of that transistor. The term "off state" refers to a state in which the gate of a relevant transistor is applied with a voltage below a threshold voltage of that transistor, and does not exclude, for example, a state in which a minute current such as a leakage current of the transistor flows.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A switching device comprising:
   a first terminal;
   a second terminal;
   a first transistor including a first end coupled to a first node and a second end coupled to the first terminal;
   a second transistor including a first end coupled to a second node and a second end coupled to the second terminal;
   a third transistor including a first end coupled to a third node to which a first voltage is supplied and a second end coupled to the first node;
   a fourth transistor including a first end coupled to the third node and a second end coupled to the second node; and
   a control circuit configured to control the first transistor, the second transistor, the third transistor, and the fourth transistor, wherein
   the control circuit is configured to, when supply of the first voltage to the third node is stopped, turn the second transistor from an off state to an on state, turn the third transistor and the fourth transistor from an on state to an off state, and after a first period passes, turn the first transistor from an off state to an on state.

2. The switching device according to claim 1, wherein the first period is longer than a period required for the third transistor and the fourth transistor to switch from the on state to the off state.

3. The switching device according to claim 1, further comprising:
   a first N-channel type transistor including a first end coupled to the first terminal and a gate coupled to the first node; and
   a second N-channel type transistor including a first end coupled to the second terminal, a second end coupled to a second end of the first N-channel type transistor, and a gate coupled to the second node.

4. The switching device according to claim 1, further comprising:
   a third terminal coupled to the first node; and
   a fourth terminal coupled to the second node.

5. The switching device according to claim 1, further comprising a charge pump circuit configured to generate the first voltage and output the generated first voltage to the third node.

* * * * *